United States Patent
Griffin et al.

(10) Patent No.: US 12,223,239 B2
(45) Date of Patent: Feb. 11, 2025

(54) SIMULATING OPERATING CONDITIONS OF QUANTUM COMPUTING DEVICES

(71) Applicant: Red Hat, Inc., Raleigh, NC (US)

(72) Inventors: Leigh Griffin, Waterford (IE); Stephen Coady, Waterford (IE)

(73) Assignee: Red Hat, Inc., Raleigh, NC (US)

( * ) Notice: Subject to any disclaimer, the term of this patent is extended or adjusted under 35 U.S.C. 154(b) by 860 days.

(21) Appl. No.: 17/360,629

(22) Filed: Jun. 28, 2021

(65) Prior Publication Data

US 2022/0414286 A1    Dec. 29, 2022

(51) Int. Cl.
*G06F 30/20* (2020.01)
*G06N 10/00* (2022.01)

(52) U.S. Cl.
CPC .............. *G06F 30/20* (2020.01); *G06N 10/00* (2019.01)

(58) Field of Classification Search
CPC ................................ G06F 30/20; G06N 10/00
See application file for complete search history.

(56) References Cited

U.S. PATENT DOCUMENTS

| | | | |
|---|---|---|---|
| 10,943,179 B2 | 3/2021 | Garrison et al. | |
| 2020/0074346 A1* | 3/2020 | Griffin | G06N 20/00 |
| 2020/0117764 A1* | 4/2020 | Zuccarelli | G06N 10/00 |
| 2020/0201655 A1 | 6/2020 | Griffin et al. | |

FOREIGN PATENT DOCUMENTS

| | | |
|---|---|---|
| CN | 111782361 A | 10/2020 |
| WO | 2020047426 A1 | 3/2020 |

OTHER PUBLICATIONS

Wild, K., Breitenbücher, U., Harzenetter, L., Leymann, F., Vietz, D. and Zimmermann, M., Oct. 2020, TOSCA4QC: two modeling styles for TOSCA to automate the deployment and orchestration of quantum applications. In 2020 IEEE 24th International Enterprise Distributed Object Computing Conference (Year: 2020).*

Al-Rahayfeh, A. et al., "Novel Approach to Task Scheduling and Load Balancing Using the Dominant Sequence Clustering and Mean Shift Clustering Algorithms," Future Internet, vol. 11, May 8, 2019, MDPI, 16 pages.

Ban Hamed Adbul Ridah, "Task Scheduling algorithm in cloud computing: A Dynamic Variable Quantum Round robin," Journal of Physics: Conference Series, vol. 1664, Jun. 2020, IOP Publishing Ltd., 10 pages.

(Continued)

*Primary Examiner* — Chuen-Meei Gan
(74) *Attorney, Agent, or Firm* — Dority & Manning, P.A.

(57) ABSTRACT

Simulating operating conditions for quantum computing devices is disclosed. In one example, a processor device of a staging computing device (i.e., a classical non-quantum computing device) receives an operating parameter from a quantum computing device, wherein the operating parameter represents an operating condition of the quantum computing device. The processor device also receives a quantum service definition that defines a quantum service. A quantum simulator of the processor device accesses the quantum service definition, simulates the operating condition of the quantum computing device based on the operating parameter, and then executes the quantum service under the simulated operating condition based on the quantum service definition.

16 Claims, 7 Drawing Sheets

(56) References Cited

OTHER PUBLICATIONS

Bhatia, M. et al., "Quantumized approach of load scheduling in fog computing environment for IoT applications," Computing, vol. 102, Jan. 9, 2020, Springer, pp. 1097-1115.

Britt, K.A. et al., "High-performance computing with quantum processing units," Abstract, ACM Journal on Emerging Technologies in Computing Systems, vol. 13, Issue 3, Mar. 1, 2017, Association for Computing Machinery, 3 pages.

* cited by examiner

SIMULATING OPERATING CONDITIONS OF QUANTUM COMPUTING DEVICES

BACKGROUND

Quantum computing involves the use of quantum bits, referred to herein as "qubits," which have characteristics that differ from those of classical (i.e., non-quantum) bits used in classical computing. Qubits may be employed by quantum services that are executed by quantum computing devices.

Development of a quantum service may be performed on a classical computing device using a quantum simulator before the quantum service is deployed to a production quantum computing device. As quantum computing continues to increase in popularity and become more commonplace, an ability to perform more effective development and testing of quantum services prior to deployment will be desirable.

SUMMARY

The examples disclosed herein implement a quantum simulator for simulating operating conditions of quantum computing devices. The quantum simulator receives an operating parameter that indicates an operating condition of a quantum computing device, and also accesses a quantum service definition that defines a quantum service. The quantum simulator then simulates the operating condition of the quantum computing device based on the operating parameter, and executes the quantum service under the simulated operating condition based on the quantum service definition. In this manner, development and testing of the quantum service can be performed under simulated operating conditions that mirror actual real-time or historical operating conditions of the quantum computing device on which the quantum service will be deployed.

In one example, a method for simulating operating conditions of quantum computing devices is disclosed. The method comprises receiving, by a staging computing device, an operating parameter from a quantum computing device, wherein the operating parameter represents an operating condition of the quantum computing device. The method further comprises receiving, by the staging computing device, a quantum service definition that defines a quantum service. The method also comprises accessing, by a quantum simulator of the staging computing device, the quantum service definition. The method additionally comprises simulating, by the quantum simulator, the operating condition of the quantum computing device based on the operating parameter. The method further comprises executing, by the quantum simulator, the quantum service under the simulated operating condition based on the quantum service definition.

In another example, a staging computing device for simulating operating conditions of quantum computing devices is disclosed. The staging computing device comprises a classical computing device comprising a system memory and a processor device communicatively coupled to the system memory. The processor device is to receive an operating parameter from a quantum computing device, wherein the operating parameter represents an operating condition of the quantum computing device. The processor device is further to receive a quantum service definition that defines a quantum service. The processor device is also to access, using a quantum simulator, the quantum service definition. The processor device is additionally to simulate, using the quantum simulator, the operating condition of the quantum computing device based on the operating parameter. The processor device is further to execute, using the quantum simulator, the quantum service under the simulated operating condition based on the quantum service definition.

In another example, a non-transitory computer-readable medium is disclosed. The non-transitory computer-readable medium stores thereon computer-executable instructions that, when executed, cause one or more processor devices to receive an operating parameter from a quantum computing device, wherein the operating parameter represents an operating condition of the quantum computing device. The computer-executable instructions further cause the one or more processor devices to receive a quantum service definition that defines a quantum service. The computer-executable instructions also cause the one or more processor devices to access the quantum service definition. The computer-executable instructions additionally cause the one or more processor devices to simulate the operating condition of the quantum computing device based on the operating parameter. The computer-executable instructions further cause the one or more processor devices to execute the quantum service under the simulated operating condition based on the quantum service definition.

Individuals will appreciate the scope of the disclosure and realize additional aspects thereof after reading the following detailed description of the examples in association with the accompanying drawing figures.

BRIEF DESCRIPTION OF THE DRAWINGS

The accompanying drawing figures incorporated in and forming a part of this specification illustrate several aspects of the disclosure and, together with the description, serve to explain the principles of the disclosure.

DETAILED DESCRIPTION

Figure 1:
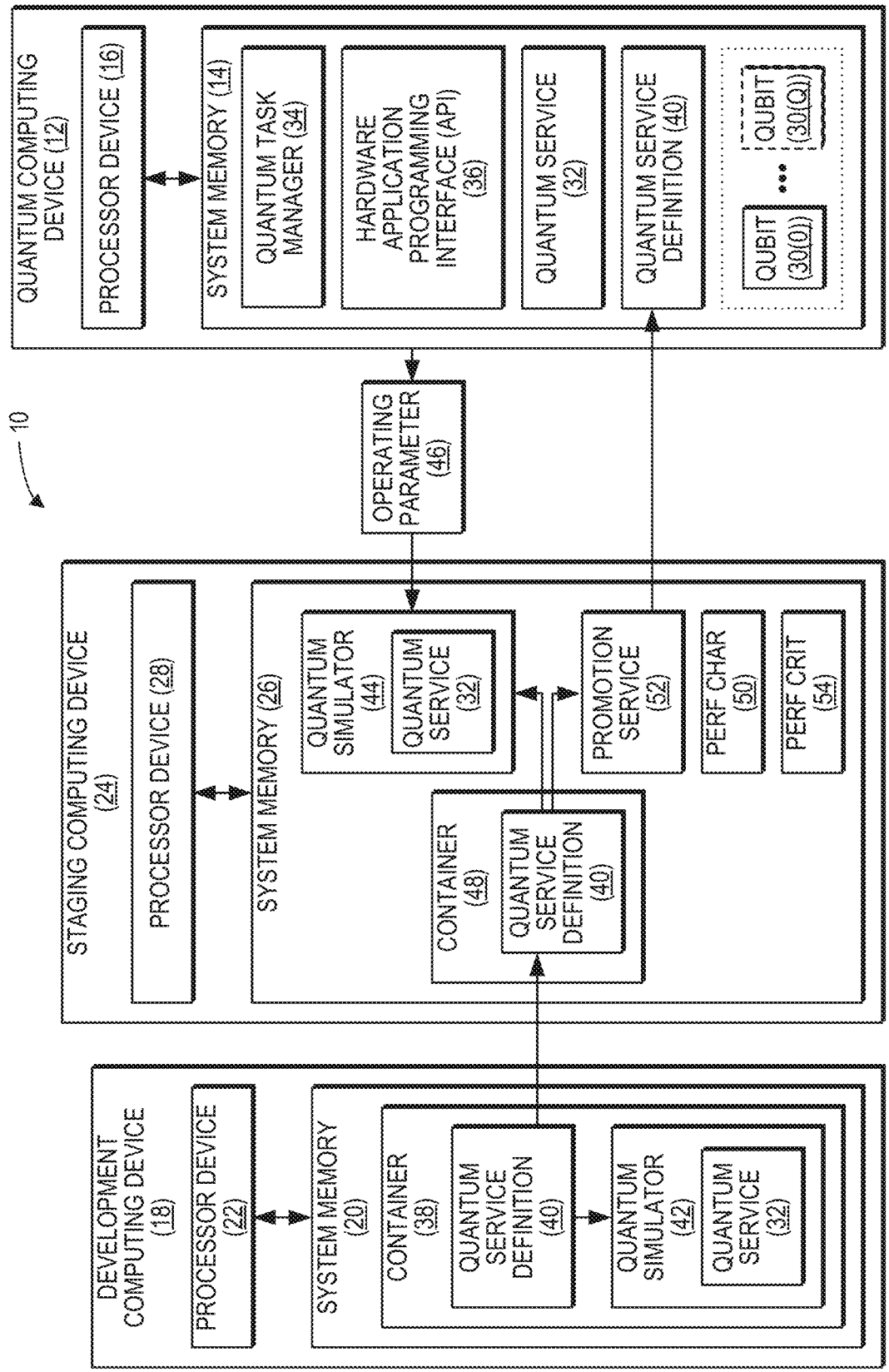
FIG. 1 is a block diagram of a computing system in which examples may be practiced.

The examples set forth below represent the information to enable individuals to practice the examples and illustrate the best mode of practicing the examples. Upon reading the following description in light of the accompanying drawing figures, individuals will understand the concepts of the disclosure and will recognize applications of these concepts not particularly addressed herein. It should be understood that these concepts and applications fall within the scope of the disclosure and the accompanying claims.

Any flowcharts discussed herein are necessarily discussed in some sequence for purposes of illustration, but unless otherwise explicitly indicated, the examples are not limited to any particular sequence of steps. The use herein of ordinals in conjunction with an element is solely for distinguishing what might otherwise be similar or identical labels, such as "first quantum service" and "second quantum service," and does not imply a priority, a type, an importance, or other attribute, unless otherwise stated herein. The term "about" used herein in conjunction with a numeric value means any value that is within a range of ten percent greater than or ten percent less than the numeric value. As used herein and in the claims, the articles "a" and "an" in reference to an element refers to "one or more" of the element unless otherwise explicitly specified. The word "or" as used herein and in the claims is inclusive unless contextually impossible. As an example, the recitation of A or B means A, or B, or both A and B.

Quantum computing involves the use of quantum bits, referred to herein as "qubits," which have characteristics that differ from those of classical (i.e., non-quantum) bits used in classical computing. Qubits may be employed by quantum services that are executed by quantum computing devices. Because qubits generally require very specific environmental conditions for operation, development of quantum services is generally not performed on quantum computing devices, but rather is performed using development software and quantum simulators that execute on classical (i.e., non-quantum) computing devices. For example, a developer may execute development software within a container provided by an application container framework to write and test a quantum service definition that defines a quantum service. Upon reaching a desired level of confidence in the performance of the quantum service in the quantum simulator, the quantum service definition may be transferred to and executed by a quantum computing device as the quantum service. However, the actual operating conditions under which the quantum service will execute on the quantum computing device (e.g., number of available qubits, processor load, available memory, number of concurrently executing processes, and the like) may not match the operating conditions under which the quantum service was developed. As a result, the quantum service may not be optimized for performance on the quantum computing device.

In this regard, the examples disclosed herein implement a quantum simulator for simulating operating conditions of a quantum computing device. As used herein, the term "quantum simulator" refers to functionality provided by a classical computing device for employing a quantum service definition to simulate the execution of a corresponding quantum service. The term "quantum service" and derivatives thereof refer to a process that executes on a quantum computing device, and that accesses one or more qubits to provide a desired functionality. In exemplary operation, a processor device of a staging computing device (i.e., a classical computing device) executes a quantum simulator that receives an operating parameter from a quantum computing device. The operating parameter represents an operating condition of the quantum computing device and may include, as non-limiting examples, a count of available qubits of the quantum computing device, a processor load of the quantum computing device, an amount of available memory of the quantum computing device, or a count of executing processes of the quantum computing device. In some examples, the operating parameter may represent a real-time operating parameter that indicates a current operating condition of the quantum computing device, and may be obtained from a quantum task manager of the quantum computing device or obtained via a hardware application programming interface (API) provided by the quantum computing device. Some examples may provide that the operating parameter represents a historical operating parameter that indicates a previous operating condition of the quantum computing device.

The staging computing device also receives (e.g., from a classical computing device that functions as a development computing device for developing and testing quantum services) a quantum service definition that defines a quantum service. The quantum simulator accesses the quantum service definition. The quantum simulator then simulates the operating condition of the quantum computing device based on the operating parameter. For instance, the quantum simulator may limit the amount of memory or the number of available simulated qubits based on the operating parameter, and/or may restrict the availability of other simulated system resources based on the operating parameter. The quantum simulator then executes the quantum service under the simulated operating condition based on the quantum service definition.

The staging computing device in some examples may further measure a performance characteristic (e.g., execution speed, system resource consumption, results generated, errors generated, and the like) of the quantum service during execution by the quantum simulator. Based on the measuring of the performance characteristic, the quantum service definition may be modified (either in response to manually provided user input, or automatically by the staging computing device). In this manner, the quantum service definition can be updated based on the performance of the quantum service under the simulated operating condition provided by the quantum simulator. Some examples may provide that the staging computing device may determine that the performance characteristic of the quantum service satisfied a performance criterion and, in response, may "promote" the quantum service definition to the quantum computing device. The process of promoting the quantum service definition may comprise transferring the quantum service definition to the quantum computing device, and initiating execution of the quantum service by the quantum computing device.

FIG. 1 is a block diagram of a computing system 10 according to one example. The computing system 10 includes a quantum computing device 12 that comprises a system memory 14 and a processor device 16. The computing system 10 of FIG. 1 further includes a development computing device 18, which is a classical computing device that comprises a system memory 20 and a processor device 22. The computing system 10 of FIG. 1 also includes a staging computing device 24, which is a classical computing device that comprises a system memory 26 and a processor device 28. The quantum computing device 12, the development computing device 18, and the staging computing device 24 are all communicatively coupled via a classical communications link (not shown), which may comprise a private network or a public network such as the internet. It is to be understood that the computing system 10, according to some examples, may include other quantum computing devices and/or classical computing devices that are not illustrated in FIG. 1. Additionally, the quantum computing device 12, the development computing device 18, and/or the staging computing device 24 in some examples may include constituent elements in addition to those illustrated in FIG. 1.

The quantum computing device 12 in the example of FIG. 1 represents a "production" environment in which quantum services are executed to provide desired functionality. The quantum computing device 12 operates in quantum environments, but is capable of operating using classical computing principles or quantum computing principles. When using quantum computing principles, the quantum computing device 12 performs computations that utilize quantum-mechanical phenomena, such as superposition and/or entanglement states. The quantum computing device 12 may operate under certain environmental conditions, such as at or near zero degrees(0°) Kelvin. When using classical computing principles, the quantum computing device 12 utilizes binary digits that have a value of either zero (0) or one (1).

In the example of FIG. 1, the quantum computing device 12 implements a set of one or more qubits 30(0)-30(Q) for use by quantum services executed by the quantum computing device 12. To maintain information for the qubit(s) 30(0)-30(Q), the quantum computing device 12 may include a qubit registry (not shown), which comprises a plurality of qubit registry entries each corresponding to a qubit such as the one or more qubits 30(0)-30(Q). The qubit registry maintains and provides access to data relating to the qubits implemented by the quantum computing device 12, such as a count of the total number of qubits implemented by the quantum computing device 12 and a count of the number of available qubits that are currently available for allocation, as non-limiting examples. Each of the qubit registry entries of the qubit registry also stores qubit metadata for a corresponding qubit. The qubit metadata may include, as non-limiting examples, an identifier of the corresponding qubit, an availability indicator that indicates whether the corresponding qubit is available for use or is in use by a specific quantum service, an identifier of a quantum service that is associated with the corresponding qubit or to which the corresponding qubit is allocated, and/or an entanglement indicator that indicates whether the corresponding qubit is in an entangled state.

The quantum computing device 12 of FIG. 1 executes one or more quantum services, such as a quantum service 32. The quantum service 32 is a process that employs qubits such as the one or more qubits 30(0)-30(Q) to provide desired functionality. Execution of quantum services such as the quantum service 32 is facilitated by a quantum task manager 34, which handles operations for creating, monitoring, and terminating quantum services. The quantum task manager 34 may provide an interface (not shown) through which other services or tasks may request specific information regarding the qubits 30(0)-30(Q), the quantum service 32, or the quantum computing device 12. Additionally, information regarding the status and functionality of the quantum computing device 12 and the elements thereof may be made accessible to other processes via a hardware application programming interface (API) 36.

Because qubits such as the qubits 30(0)-30(Q) generally require very specific environmental conditions for operation, development of quantum services such as the quantum service 32 generally is not performed on the quantum computing device 12, but rather is performed on a separate device such as the development computing device 18. In the example of FIG. 1, the development computing device 18 provides a container 38, which may be provided by a convention application container framework such as Docker. The container 38 provides an operating environment that is isolated from other processes executing on the development computing device 18, and to which predefined levels of system resources (e.g., memory, processor cycles, system bandwidth, and the like) of the development computing device 18 may be allocated.

Within the container 38, a quantum service definition 40 that defines the quantum service 32 may be generated and revised using conventional development tools (not shown). The quantum service definition 40 may then be provided to a quantum simulator 42 such as the Qiskit quantum computing framework, which is an open-source framework that provides tools for creating and manipulating quantum programs and services and simulating execution of the quantum programs and services on classical computing devices. Within the quantum simulator 42, the quantum service 32 is executed based on the quantum service definition 40. Based on the performance of the quantum service 32 within the quantum simulator 42, the quantum service definition 40 may be further refined and tested until it is determined to be suitable for promotion to the quantum computing device 12. It is to be understood that, while FIG. 1 illustrates only a single container 38, the development computing device 18 may provide multiple containers.

However, this approach to development of quantum services may suffer from disadvantages. In particular, differences in the operating conditions of the quantum computing device 12 and the development computing device 18 may result in the quantum service 32 performing suboptimally on the quantum computing device 12. Additionally, the transition of the quantum service 32 from the container 38 of the development computing device 18 to the quantum computing device 12 may be inconsistent with the developer workflow based on the use of containers such as the container 38. Accordingly, an ability to perform development and testing of quantum services under operating conditions that mirror actual or historical operating conditions of the quantum computing device 12 prior to deployment will be desirable.

In this regard, the staging computing device 24 of FIG. 1 implements a quantum simulator 44 for simulating operating conditions of the quantum computing device 12 for developing and testing quantum services such as the quantum service 32. In exemplary operation, the quantum simulator 44 receives an operating parameter 46 from the quantum computing device 12. The operating parameter 46 represents an operating condition of the quantum computing device, such as a count of available qubits 30(0)-30(Q) of the quantum computing device 12, a processor load of the quantum computing device 12, an amount of available memory within the system memory 14 of the quantum computing device 12, or a count of executing processes of the quantum computing device 12.

In some examples, the operating parameter 46 represents a real-time operating parameter that indicates a current operating condition of the quantum computing device 12. In such examples, the operating parameter 46 may be obtained from the quantum task manager 34 of the quantum computing device 12, or may obtained via the hardware API 36 provided by the quantum computing device 12. Some examples may provide that the operating parameter 46 represents a historical operating parameter that indicates a previous operating condition of the quantum computing device 12. The operating parameter 46 in such examples may be provided as part of a hardware profile snapshot (not shown) that records the operating condition of the quantum computing device 12 at a particular point in time. It is to be understood that, while FIG. 1 illustrates only a single operating parameter 46, some examples may provide that the quantum simulator 44 receives multiple operating parameters corresponding to multiple operating conditions of the quantum computing device 12. In such examples, the multiple operating parameters may be received at a same point in time, or may be received over a time interval.

The staging computing device 24 also receives the quantum service definition 40 that defines the quantum service 32 from the development computing device 18. The quantum service definition 40 in some examples may be received by a container 48, which provides an operating environment and development tools in a manner similar to the container 38 of the development computing device 18. To execute the quantum service 32, the quantum simulator 44 accesses the quantum service definition 40 received from the development computing device 18. The quantum simulator 44 then simulates the operating condition of the quantum computing device 12 based on the operating parameter 46 received from the quantum computing device 12. As non-limiting examples, the quantum simulator 44 may limit an amount of memory or a number of available simulated qubits based on the operating parameter 46, and/or may restrict the availability of other simulated system resources based on the operating parameter 46. The quantum simulator 44 then executes the quantum service 32 under the simulated operating condition based on the quantum service definition 40.

In some examples, the staging computing device 24 may further measure a performance characteristic (captioned as "PERF CHAR" in FIG. 1) 50 of the quantum service 32 during execution by the quantum simulator 44. It is to be understood that, while FIG. 1 illustrates only one performance characteristic 50, the staging computing device 24 according to some examples may measure multiple performance characteristics 50 of the quantum service 32. The performance characteristic 50 may comprise any attribute of the quantum service 32 measurable by the quantum simulator 44, and may include, as non-limiting examples, execution speed of the quantum service 32, system resource consumption by the quantum service 32, results generated by the quantum service 32, errors generated by the quantum service 32, and the like.

Based on the measuring of the performance characteristic 50, the quantum service definition 40 in some examples may be modified. For example, the quantum service definition 40 may be modified in response to manually provided user input (e.g., a developer may edit the quantum service definition 40), or may be automatically modified by the staging computing device 24. In this manner, the quantum service definition 40 can be updated based on the performance of the quantum service 32 under the simulated operating condition provided by the quantum simulator 44.

Some examples may provide that the staging computing device 24 further implements a promotion service 52 for determining whether the quantum service 32 is suitable for promotion to the production environment provided by the quantum computing device 12, and for performing operations for promoting the quantum service 32. In such examples, a performance criterion (captioned as "PERF CRIT" in FIG. 1) 54 is provided to specify a desired threshold for the performance characteristic 50. It is to be understood that, in examples in which multiple performance characteristics 50 are measured, corresponding multiple performance criteria 54 may be provided. After the performance characteristic 50 is measured, the promotion service 52 may determine that the performance characteristic 50 satisfies the performance criterion 54. The promotion service 52 then transfers the quantum service definition 40 to the quantum computing device 12, and initiates execution of the quantum service 32 by the quantum computing device 12 based on the quantum service definition 40.

It is to be understood that, because the quantum simulator 44 and the promotion service 52 are components of the staging computing device 24, functionality implemented by the quantum simulator 44 and the promotion service 52 may be attributed to the computing system 10 generally. Moreover, in examples where the quantum simulator 44 and the promotion service 52 comprise software instructions that program the processor device 28 to carry out functionality discussed herein, functionality implemented by the quantum simulator 44 and the promotion service 52 may be attributed herein to the processor device 28. It is to be further understood that while, for purposes of illustration only, the quantum simulator 44 and the promotion service 52 are each depicted as a single component, the functionality implemented by the quantum simulator 44 and the promotion service 52 may be implemented in any number of components, and the examples discussed herein are not limited to any particular number of components.

Figure 2A:
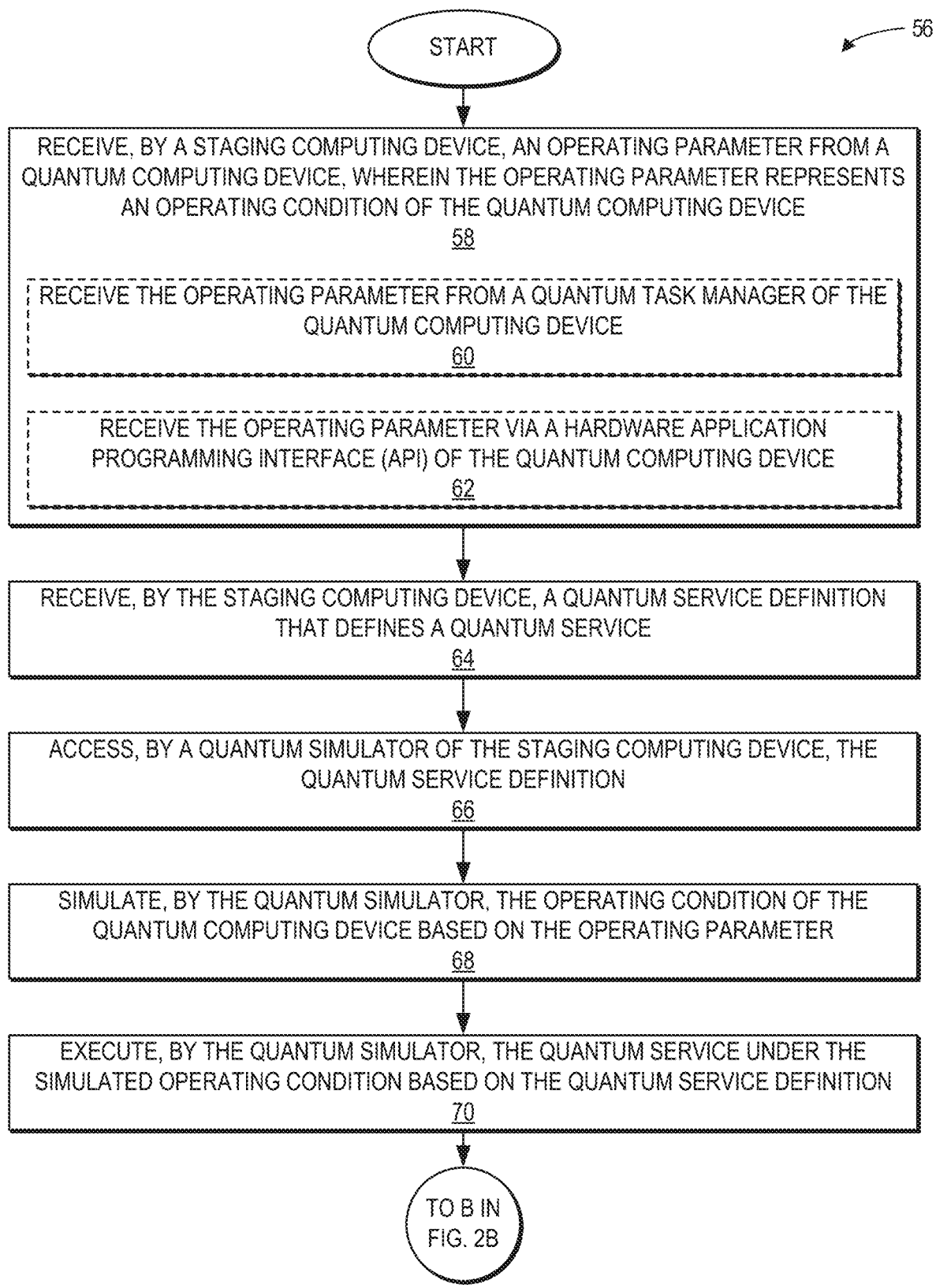
FIGS. 2A-2B are flowcharts illustrating operations performed by the computing system of FIG. 1 for simulating operating conditions of quantum computing devices, according to one example.
Figure 2B:
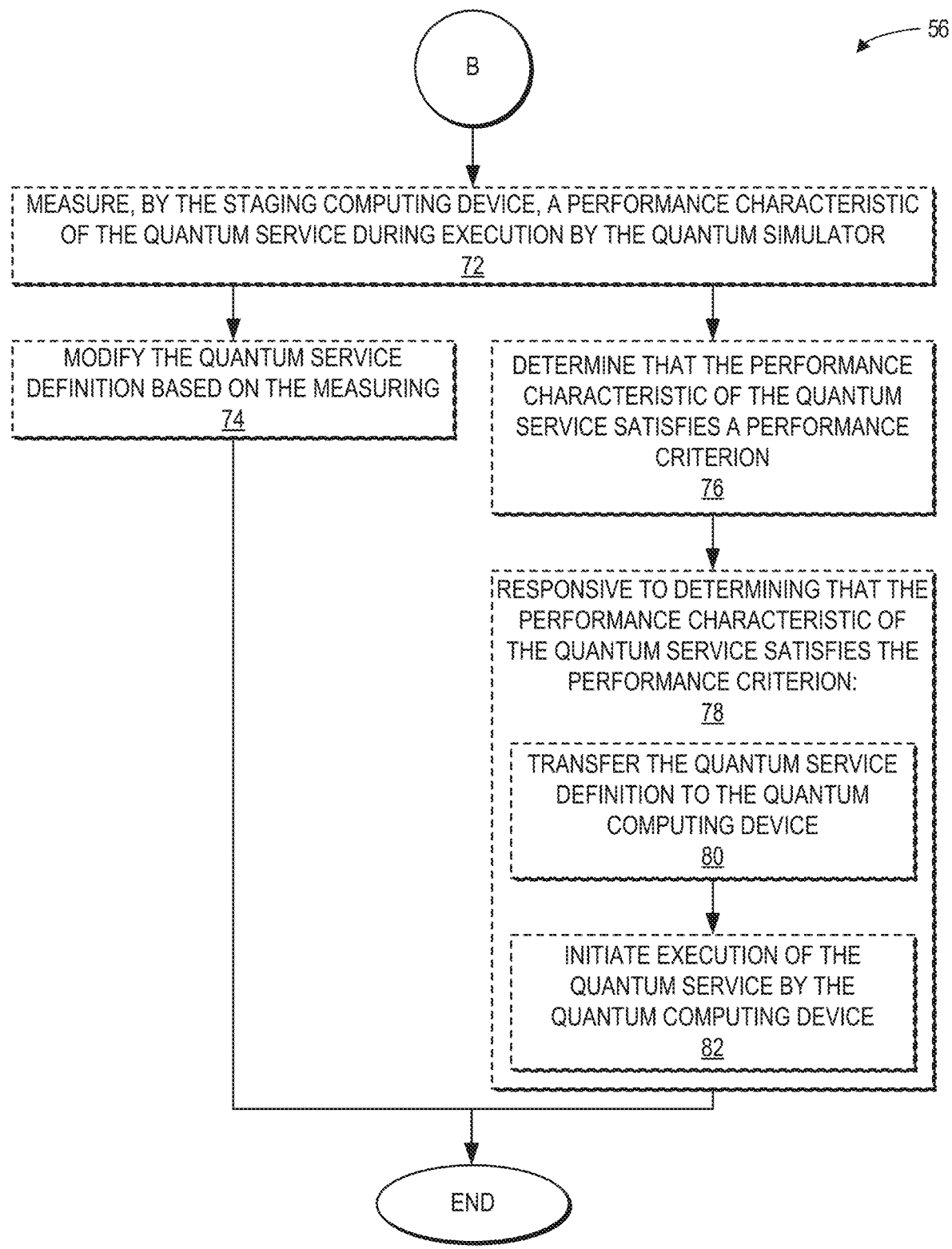

To illustrate exemplary operations performed by the computing system 10 of FIG. 1 for simulating operating conditions of quantum computing devices according to one example, FIGS. 2A and 2B provide a flowchart 56. Elements of FIG. 1 are referenced in describing FIGS. 2A and 2B for the sake of clarity. In FIG. 2A, operations begin with a processor device of a staging computing device (e.g., the processor device 28 of the staging computing device 24 of FIG. 1) receiving an operating parameter (such as the operating parameter 46 from the quantum computing device 12 of FIG. 1), wherein the operating parameter 46 represents an operating condition of the quantum computing device 12 (block 58). In some examples in which the operating parameter 46 is a real-time operating parameter, the operations of block 58 for receiving the operating parameter 46 may comprise receiving the operating parameter 46 from the quantum task manager 34 of the quantum computing device 12 (block 60). Some examples in which the operating parameter 46 is a real-time operating parameter may provide that the operations of block 58 for receiving the operating parameter 46 comprise receiving the operating parameter 46 via the hardware API 36 of the quantum computing device 12 (block 62).

The processor device 28 of the staging computing device 24 also receives a quantum service definition that defines a quantum service, such as the quantum service definition 40 that defines the quantum service 32 (block 64). The quantum service definition 40 in some examples may be received from a development computing device, such as the development computing device 18 of FIG. 1, that provides a development environment in which the quantum service definition 40 is written and edited by a user. A quantum simulator of the staging computing device 24 (e.g., the quantum simulator 44 of FIG. 1) then accesses the quantum service definition 40 (block 66).

The quantum simulator 44 simulates the operating condition of the quantum computing device 12 based on the operating parameter 46 (block 68). The quantum simulator 44 then executes the quantum service 32 under the simulated operating condition based on the quantum service definition 40 (block 70). Operations in some examples may then continue at block 72 of FIG. 2B.

Referring now to FIG. 2B, in some examples the processor device 28 of the staging computing device 24 may measure a performance characteristic of the quantum service 32 (e.g., the performance characteristic 50 of FIG. 1) during execution by the quantum simulator 44 (block 72). Some examples may provide that, after measuring the performance characteristic 50 at block 72, the processor device 28 may modify the quantum service definition 40 based on the measuring (e.g., in response to user input as a result of the measuring, or automatically based on a result of the measuring) (block 74). In some examples, after measuring the performance characteristic 50 at block 72, the processor device 28 may determine (e.g., using the promotion service 52 of FIG. 1) that the performance characteristic 50 of the quantum service 32 satisfies a performance criterion, such as the performance criterion 54 of FIG. 1 (block 76). Responsive to determining that the performance characteristic 50 of the quantum service 32 satisfies the performance criterion 54, the processor device 28 may carry out a series of operations (block 78). The processor device 28 (e.g., using the promotion service 52) transfers the quantum service definition 40 to the quantum computing device 12 (block 80). The processor device 28 may then initiate execution of the quantum service 32 by the quantum computing device 12 (block 82).

Figure 3:
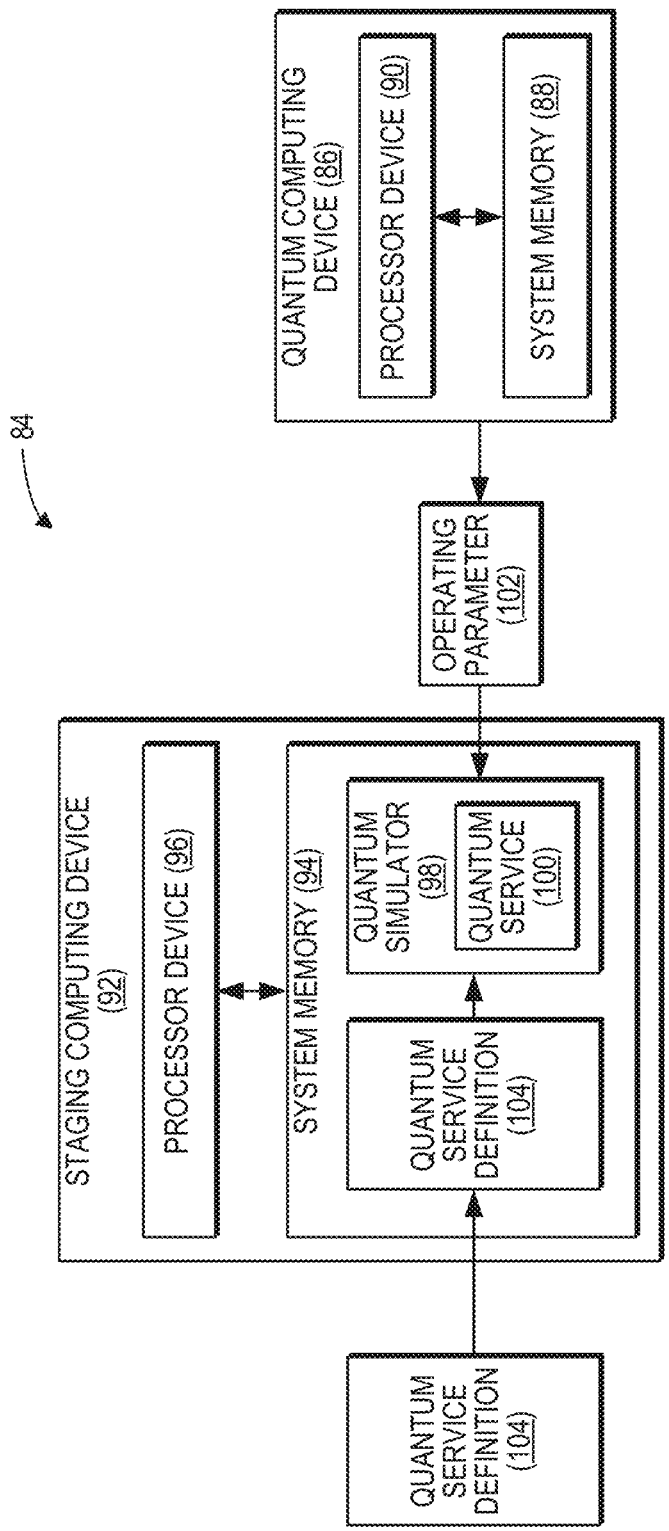
FIG. 3 is a simpler block diagram of the computing system of FIG. 1 for simulating operating conditions of quantum computing devices, according to one example.

FIG. 3 is a simpler block diagram of the computing system 10 of FIG. 1 for simulating operating conditions of quantum computing devices, according to one example. In the example of FIG. 3, a computing system 84 includes a quantum computing device 86 that comprises a system memory 88 and a processor device 90, and further includes a staging computing device 92, which is a classical computing device that comprises a system memory 94 and a processor device 96. The staging computing device 92 of FIG. 1 implements a quantum simulator 98 for simulating operating conditions of the quantum computing device 86 for developing and testing quantum services such as a quantum service 100.

In exemplary operation, the quantum simulator 98 receives an operating parameter 102 from the quantum computing device 86. The operating parameter 102 represents an operating condition of the quantum computing device 86. The staging computing device 92 also receives a quantum service definition 104 that defines the quantum service 100. To execute the quantum service 100, the quantum simulator 98 accesses a quantum service definition 104. The quantum simulator 98 simulates the operating condition of the quantum computing device 86 based on the operating parameter 102 received from the quantum computing device 86. The quantum simulator 98 then executes the quantum service 100 under the simulated operating condition based on the quantum service definition 104.

Figure 4:
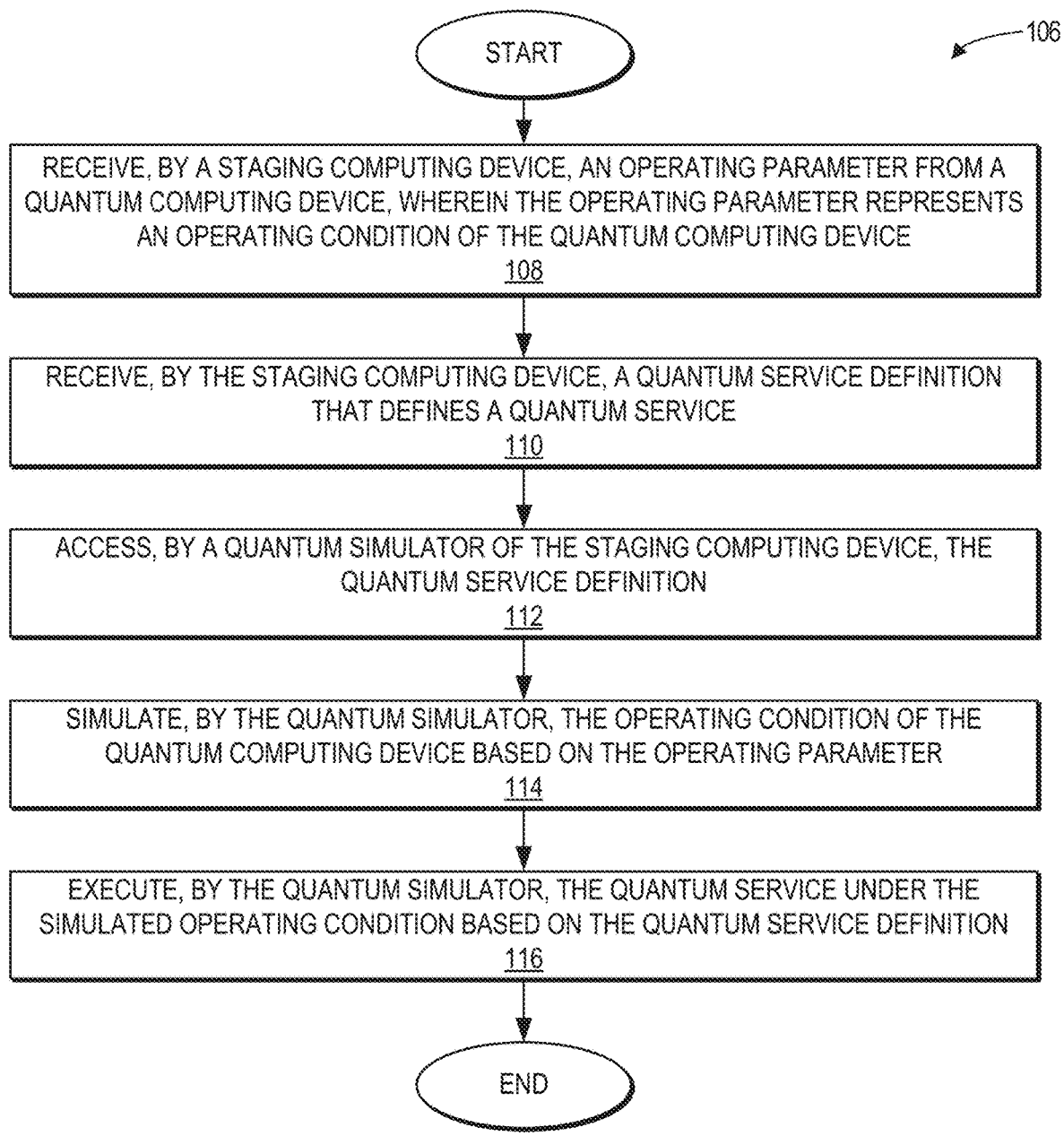
FIG. 4 is a flowchart of a simplified method for simulating operating conditions of quantum computing devices by the staging computing device of FIG. 3, according to one example.

FIG. 4 provides a flowchart 106 of a simplified method for simulating operating conditions of quantum computing devices by the staging computing device 92 of FIG. 3, according to one example. For the sake of clarity, elements of FIG. 3 are referenced in describing FIG. 4. Operations in FIG. 4 begin with the processor device 96 of the staging computing device 92 receiving the operating parameter 102 from the quantum computing device 86, wherein the operating parameter 102 represents an operating condition of the quantum computing device 86 (block 108). The processor device 96 also receives the quantum service definition 104 that defines the quantum service 100 (block 110). The processor device 96 accesses, using the quantum simulator 98 of the staging computing device 92, the quantum service definition 104 (block 112). The quantum simulator 98 simulates the operating condition of the quantum computing device 86 based on the operating parameter 102 (block 114). Finally, the quantum simulator 98 executes the quantum service 100 under the simulated operating condition based on the quantum service definition 104 (block 116).

Figure 5:
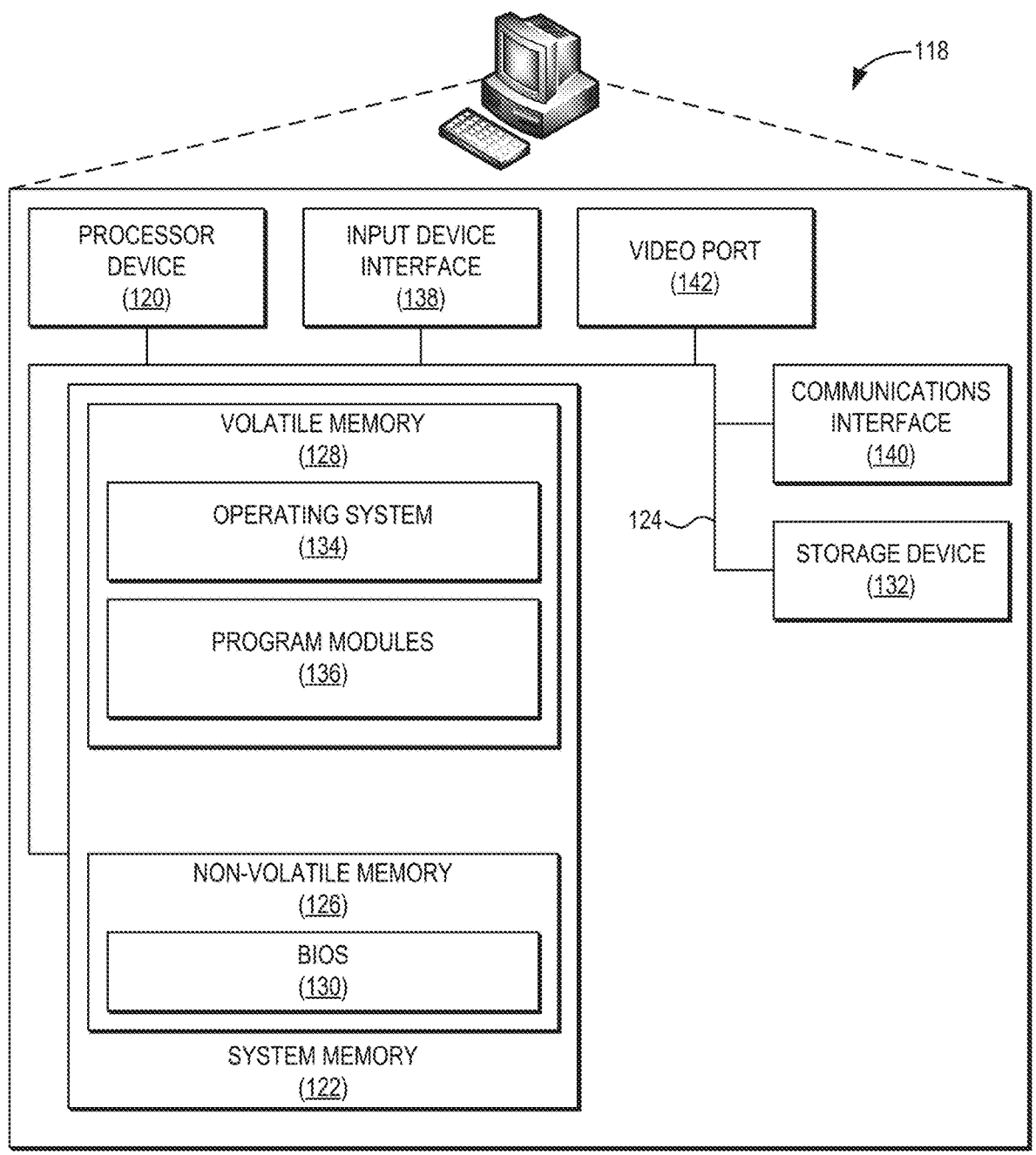
FIG. 5 is a block diagram of a classical computing device suitable for implementing examples, according to one example.

FIG. 5 is a block diagram of a processor-based computing device 118 ("computing device 118" or "classical computing device 118"), such as the development computing device 18 and the staging computing device 24 of FIG. 1, suitable for implementing examples according to one example. The computing device 118 may comprise any computing or electronic device capable of including firmware, hardware, and/or executing software instructions to implement the functionality described herein, such as a computer server, a desktop computing device, a laptop computing device, a smartphone, a computing tablet, or the like. The computing device 118 includes a processor device 120, a system memory 122, and a system bus 124. The system bus 124 provides an interface for system components including, but not limited to, the system memory 122 and the processor device 120. The processor device 120 can be any commercially available or proprietary processor.

The system bus 124 may be any of several types of bus structures that may further interconnect to a memory bus (with or without a memory controller), a peripheral bus, and/or a local bus using any of a variety of commercially available bus architectures. The system memory 122 may include non-volatile memory 126 (e.g., read-only memory (ROM), erasable programmable ROM (EPROM), electrically EPROM (EEPROM), etc.), and volatile memory 128 (e.g., RAM). A basic input/output system (BIOS) 130 may be stored in the non-volatile memory 126 and can include the basic routines that help to transfer information among elements within the computing device 118. The volatile memory 128 may also include a high-speed RAM, such as static RAM, for caching data.

The computing device 118 may further include or be coupled to a non-transitory computer-readable storage medium such as a storage device 132, which may comprise, for example, an internal or external hard disk drive (HDD) (e.g., enhanced integrated drive electronics (EIDE) or serial advanced technology attachment (SATA)), for storage, flash memory, or the like. The storage device 132 and other drives associated with computer-readable media and computer-usable media may provide non-volatile storage of data, data structures, computer-executable instructions, and the like. Although the description of computer-readable media above refers to an HDD, it should be appreciated that other types of media that are readable by a computer, such as Zip disks, magnetic cassettes, flash memory cards, cartridges, and the like, may also be used in the operating environment, and, further, that any such media may contain computer-executable instructions for performing novel methods of the disclosed examples.

A number of modules can be stored in the storage device 132 and in the volatile memory 128, including an operating system 134 and one or more program modules 136 which may implement the functionality described herein in whole or in part. It is to be appreciated that the examples can be implemented with various commercially available operating systems 134 or combinations of operating systems 134. All or a portion of the examples may be implemented as a computer program product stored on a transitory or non-transitory computer-usable or computer-readable storage medium, such as the storage device 132, which includes complex programming instructions, such as complex computer-readable program code, to cause the processor device 120 to carry out the steps described herein. Thus, the computer-readable program code can comprise software instructions for implementing the functionality of the examples described herein when executed on the processor device 120. The processor device 120 may serve as a controller, or control system, for the computing device 118 that is to implement the functionality described herein.

An operator may also be able to enter one or more configuration commands through a keyboard (not illustrated), a pointing device such as a mouse (not illustrated), or a touch-sensitive surface such as a display device (not illustrated). Such input devices may be connected to the processor device 120 through an input device interface 138 that is coupled to the system bus 124 but can be connected by other interfaces, such as a parallel port, an Institute of Electrical and Electronic Engineers (IEEE) 1394 serial port, a Universal Serial Bus (USB) port, an IR interface, and the like.

The computing device 118 may also include a communications interface 140 suitable for communicating with a network as appropriate or desired. The computing device 118 may also include a video port 142 to interface with a display device to provide information to a user.

Figure 6:
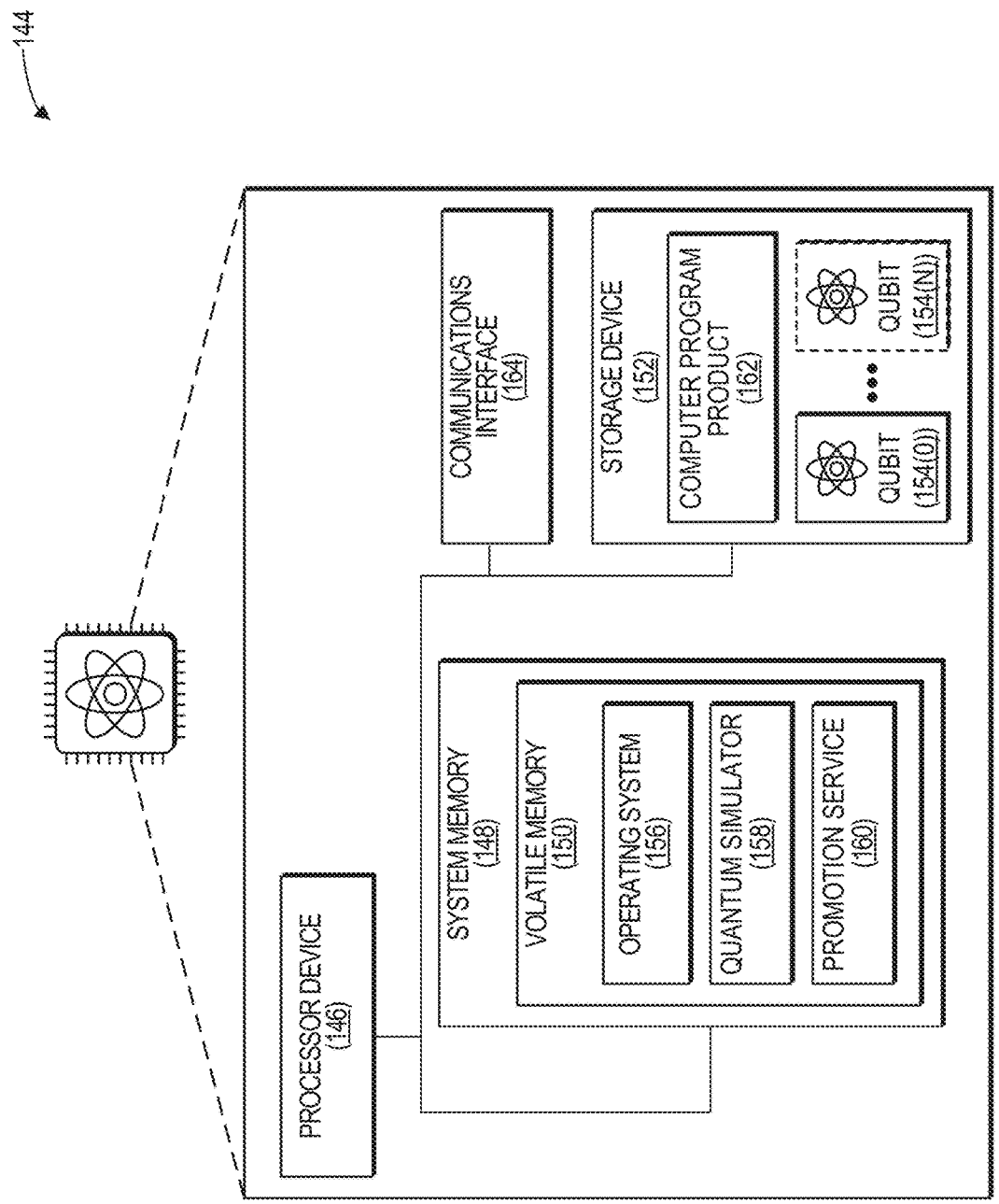
FIG. 6 is a block diagram of a quantum computing device suitable for implementing examples, according to one example.

FIG. 6 is a block diagram of a quantum computing device 144, such as the quantum computing device 12 of FIG. 1, suitable for implementing examples according to one example. The quantum computing device 144 may comprise any suitable quantum computing device or devices. The quantum computing device 144 can operate using classical computing principles or quantum computing principles. When using quantum computing principles, the quantum computing device 144 performs computations that utilize quantum-mechanical phenomena, such as superposition and entanglement. The quantum computing device 144 may operate under certain environmental conditions, such as at or near zero degrees(0°) Kelvin. When using classical computing principles, the quantum computing device 144 utilizes binary digits that have a value of either zero (0) or one (1).

The quantum computing device 144 includes a processor device 146 and a system memory 148. The processor device 146 can be any commercially available or proprietary processor suitable for operating in a quantum environment. The system memory 148 may include volatile memory 150 (e.g., random-access memory (RAM)). The quantum computing device 144 may further include or be coupled to a non-transitory computer-readable medium such as a storage device 152. The storage device 152 and other drives associated with computer-readable media and computer-usable media may provide non-volatile storage of data, data structures, computer-executable instructions, and the like. The storage device may also provide functionality for storing one or more qubits 154(0)-154(N).

A number of modules can be stored in the storage device 152 and in the volatile memory 150, including an operating system 156 and one or more modules, such as a quantum simulator 158 and a promotion service 160. All or a portion of the examples may be implemented as a computer program product 162 stored on a transitory or non-transitory computer-usable or computer-readable medium, such as the storage device 152, which includes complex programming instructions, such as complex computer-readable program code, to cause the processor device 146 to carry out the steps described herein. Thus, the computer-readable program code can comprise computer-executable instructions for implementing the functionality of the examples described herein when executed on the processor device 146.

An operator may also be able to enter one or more configuration commands through a keyboard (not illustrated), a pointing device such as a mouse (not illustrated), or a touch-sensitive surface such as a display device (not illustrated). The quantum computing device 144 may also include a communications interface 164 suitable for communicating with other quantum computing systems, including, in some implementations, classical computing devices.

Individuals will recognize improvements and modifications to the preferred examples of the disclosure. All such improvements and modifications are considered within the scope of the concepts disclosed herein and the claims that follow.

What is claimed is:

1. A method, comprising:
   receiving, by a staging computing device, an operating parameter from a particular quantum computing device, wherein the operating parameter represents an actual operating condition of the particular quantum computing device;
   receiving, by the staging computing device, a quantum service definition that defines a quantum service prior to deployment;
   accessing, by a quantum simulator of the staging computing device, the quantum service definition;
   simulating, by the quantum simulator, a simulated operating condition of the particular quantum computing device to mirror the actual operating condition of the particular quantum computing device;
   executing, by the quantum simulator, the quantum service under the simulated operating condition based on the quantum service definition;
   determining that a performance characteristic of the quantum service satisfies a performance criterion when simulated under the simulated operating condition that mirrors the actual operating condition of the particular quantum computing device; and
   responsive to determining that the performance characteristic of the quantum service satisfies the performance criterion when simulated under the simulated operating condition that mirrors the actual operating condition of the particular quantum computing device:
      deploying the quantum service definition to the particular quantum computing device; and
      causing the particular quantum computing device to initiate execution of the quantum service.

2. The method of claim 1, wherein receiving the operating parameter comprises receiving the operating parameter from a quantum task manager of the particular quantum computing device.

3. The method of claim 1, wherein receiving the operating parameter comprises receiving the operating parameter via a hardware application programming interface (API) of the particular quantum computing device.

4. The method of claim 1, wherein the operating parameter comprises one of a real-time operating parameter that indicates a current operating parameter of the particular quantum computing device and a historical operating parameter that indicates a previous operating condition of the particular quantum computing device.

5. The method of claim 1, wherein the operating parameter comprises a count of available qubits of the particular quantum computing device, a processor load of the particular quantum computing device, an amount of available memory of the particular quantum computing device, or a count of executing processes of the particular quantum computing device.

6. The method of claim 1, further comprising measuring, by the staging computing device, the performance characteristic of the quantum service during execution by the quantum simulator.

7. The method of claim 6, further comprising modifying the quantum service definition based on the measuring.

8. A staging computing device, comprising a classical computing device comprising:
   a system memory; and a processor device communicatively coupled to the system memory, the processor device to:
- receive an operating parameter from a particular quantum computing device, wherein the operating parameter represents an actual operating condition of the particular quantum computing device;
- receive a quantum service definition that defines a quantum service prior to deployment;
- access, using a quantum simulator, the quantum service definition;
- simulate, using the quantum simulator, a simulated operating condition of the particular quantum computing device to mirror the actual operating condition of the particular quantum computing device;
- execute, using the quantum simulator, the quantum service under the simulated operating condition based on the quantum service definition;
- determine that a performance characteristic of the quantum service satisfies a performance criterion when simulated under the simulated operating condition that mirrors the actual operating condition of the particular quantum computing device; and
- responsive to determining that the performance characteristic of the quantum service satisfies the performance criterion when simulated under the simulated operating condition that mirrors the actual operating condition of the particular quantum computing device:
  - deploy the quantum service definition to the particular quantum computing device; and
  - cause the particular quantum computing device to initiate execution of the quantum service.

9. The staging computing device of claim 8, wherein to receive the operating parameter is to receive the operating parameter from a quantum task manager of the particular quantum computing device.

10. The staging computing device of claim 8, wherein to receive the operating parameter is to receive the operating parameter via a hardware application programming interface (API) of the particular quantum computing device.

11. The staging computing device of claim 8, wherein the operating parameter comprises one of a real-time operating parameter that indicates a current operating parameter of the particular quantum computing device and a historical operating parameter that indicates a previous operating condition of the particular quantum computing device.

12. The staging computing device of claim 8, wherein the operating parameter comprises a count of available qubits of the particular quantum computing device, a processor load of the particular quantum computing device, an amount of available memory of the particular quantum computing device, or a count of executing processes of the particular quantum computing device.

13. The staging computing device of claim 8, wherein the processor device is further to measure, by the staging computing device, the performance characteristic of the quantum service during execution by the quantum simulator.

14. The staging computing device of claim 13, wherein the processor device is further to modify the quantum service definition based on the measuring.

15. A non-transitory computer-readable medium having stored thereon computer-executable instructions that, when executed, cause one or more processor devices to:
- receive an operating parameter from a particular quantum computing device, wherein the operating parameter represents an actual operating condition of the particular quantum computing device;
- receive a quantum service definition that defines a quantum service prior to deployment;
- access, using a quantum simulator, the quantum service definition;
- simulate, using the quantum simulator, a simulated operating condition of the particular quantum computing device to mirror the actual operating condition of the particular quantum computing device;
- execute the quantum service under the simulated operating condition based on the quantum service definition;
- determine that a performance characteristic of the quantum service satisfies a performance criterion when simulated under the simulated operating condition that mirrors the actual operating condition of the particular quantum computing device; and
- responsive to determining that the performance characteristic of the quantum service satisfies the performance criterion when simulated under the simulated operating condition that mirrors the actual operating condition of the particular quantum computing device:
  - deploy the quantum service definition to the particular quantum computing device; and
  - cause the particular quantum computing device to initiate execution of the quantum service.

16. The computer-readable medium of claim 15, wherein the operating parameter comprises one of a real-time operating parameter that indicates a current operating condition of the particular quantum computing device and a historical operating parameter that indicates a previous operating condition of the particular quantum computing device.

* * * * *